(12) United States Patent
Chen

(10) Patent No.: US 7,295,052 B2
(45) Date of Patent: Nov. 13, 2007

(54) REGENERATIVE POWER-ON CONTROL CIRCUIT

(75) Inventor: Ker-Min Chen, Hsin chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 162 days.

(21) Appl. No.: 11/196,715

(22) Filed: Aug. 3, 2005

(65) Prior Publication Data

US 2007/0030039 A1    Feb. 8, 2007

(51) Int. Cl.
*H03L 7/00* (2006.01)

(52) U.S. Cl. .................................. 327/143; 327/198

(58) Field of Classification Search .................. None
See application file for complete search history.

(56) References Cited

U.S. PATENT DOCUMENTS

| 6,563,353 B2 | 5/2003 | Chen | 327/143 |
| 7,019,417 B2 * | 3/2006 | Kang | 307/113 |
| 7,046,067 B2 * | 5/2006 | Chung | 327/333 |
| 2005/0195012 A1 * | 9/2005 | Sueoka et al. | 327/333 |

* cited by examiner

*Primary Examiner*—Kenneth B. Wells
*Assistant Examiner*—An T. Luu
(74) *Attorney, Agent, or Firm*—K & L Gates LLP

(57) ABSTRACT

A power-on control circuit includes a coupling device coupled to a first voltage supply. A first inverter, coupled between the coupling device and a complementary voltage, has an input node coupled to a second voltage supply with a supply voltage level lower than that of the first voltage supply. A level shifter, coupled between the first voltage supply and the complementary voltage, has a first input node connected to an output node of the first inverter and a second input node coupled to the second voltage supply, for generating the power-on control signal when the first voltage supply is powered up and the second voltage supply is turned off and for disabling the power-on control signal when the second voltage supply is subsequently powered up. The coupling device eliminates a leakage current path from the first voltage supply to the complementary voltage through the first inverter.

22 Claims, 4 Drawing Sheets

US 7,295,052 B2

REGENERATIVE POWER-ON CONTROL CIRCUIT

BACKGROUND

The present invention relates generally to an integrated circuit (IC) design, and more particularly to a regenerative power-on control circuit.

A power-on control circuit is typically used in a circuit environment where a number of voltages supplies are powered on sequentially in order to avoid bus contention. The power-on control circuit generates a power-on control signal controlling a post driver. When an I/O voltage supply is powered up and a core voltage supply is not, the power-on control signal would set the post driver in a high impedance state, thereby avoiding the bus contention. When the core voltage supply is powered up after the I/O voltage supply is powered on, the power-on control signal then sets the post driver in a normal operation state.

Conventional power-on control circuits employ a power-on detection mechanism to control a protection circuit that can avoid conflicting signals for the post driver during power up processes. However, these conventional power-on control circuits have certain drawbacks. For example, the control circuit may not be able to regenerate the power-on control signal to control the protection circuit when the core voltage supply is powered down and up again. As another example, the conventional power-on control circuits may consume unnecessary power when both the I/O and core voltage supplies are fully turned on.

Therefore, it is desirable to have a power-on control circuit that can regenerate the power-on control signal whenever the core voltage supply is powered up and down without consuming unnecessary power.

SUMMARY

The present invention discloses a power-on control circuit for generating a power-on control signal. In one embodiment of the invention, the power-on control circuit includes a coupling device, first inverter, and level shifter. The coupling device is coupled to a first voltage supply. The first inverter, coupled between the coupling device and a complementary voltage, has an input node coupled to a second voltage supply with a supply voltage level lower than that of the first voltage supply. The level shifter, coupled between the first voltage supply and the complementary voltage, has a first input node connected to an output node of the first inverter and a second input node coupled to the second voltage supply, for generating the power-on control signal when the first voltage supply is powered up and the second voltage supply is turned off and for disabling the power-on control signal when the second voltage supply is subsequently powered up. The coupling device eliminates a leakage current path from the first voltage supply to the complementary voltage through the first inverter.

The construction and method of operation of the invention, however, together with additional objectives and advantages thereof will be best understood from the following description of specific embodiments when read in connection with the accompanying drawings.

DESCRIPTION

Figure 1A:
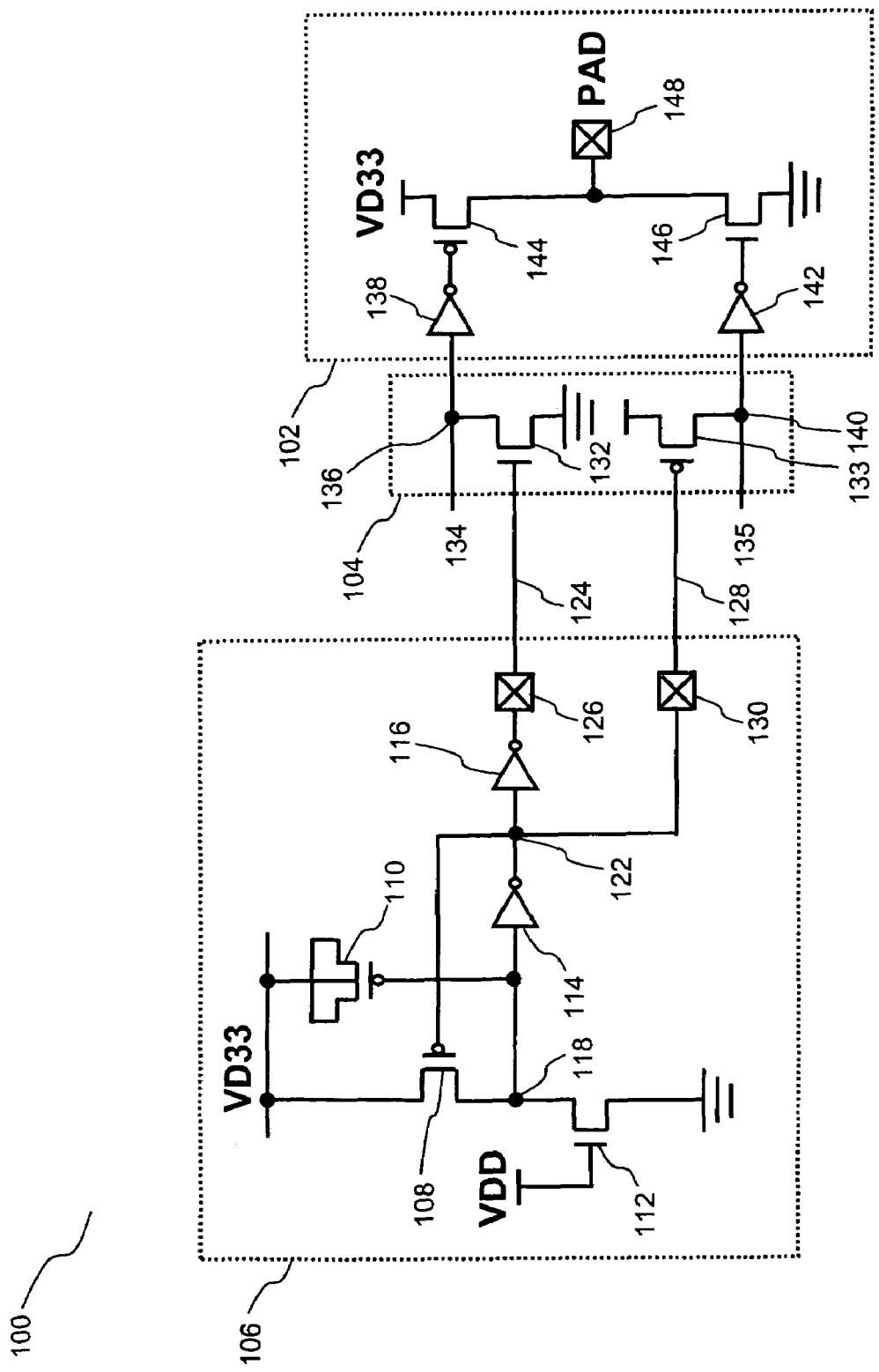
FIG. 1A schematically illustrates a conventional power-on control system.

FIG. 1A illustrates a conventional power-on control system 100 including a post driver 102 that is implemented with a protection circuit 104 and a conventional power-on control circuit 106. The conventional power-on control circuit 106 includes a PMOS transistor 108, a PMOS capacitor 110, an NMOS transistor 112, and two inverters 114 and 116. The source of the PMOS transistor 108 is coupled to an I/O voltage supply that has a supply voltage level VD33. The drain of the NMOS transistor 112 is connected to the drain of the PMOS transistor 108 via a node 118. The gate of the NMOS transistor 112 is coupled to a core voltage supply that has a supply voltage level VDD lower than VD33, and a source that is tied to ground. The PMOS capacitor 110 has both its drain and source coupled to the I/O voltage supply VD33 and its gate connected to the node 118. The input node of the inverter 114 is connected to the node 118, while the output node of the inverter 114 is connected to the input node of the inverter 116 through a node 122. The gate of the PMOS transistor 108 is also coupled to the node 122. The output node of the inverter 116 is coupled to a power-on control signal line 124 via an output pad 126. The node 122 is tied directly to another power-on control signal line 128 through another output pad 130.

The two power-on control signal lines 124 and 128 are used for controlling the protection circuit 104. If a high signal is present at the node 122, both the PMOS transistor 133 and the NMOS transistor 132 will be turned off. If a low signal is present at the node 122, both transistors 132 and 133 will be turned on. The control signals at the power-on control signal lines 124 and 128 determines if the internal signals 134 and 135 can be passed through the protection circuit 104 to the post driver 102. A high signal at the power-on control signal line 124 can turn on the NMOS transistor 132 to provide a low signal to a node 136. A low signal at the power-on control signal line 128 can turn on the PMOS transistor 133, thereby sending a high signal to a node 140. The signal at the node 136 controls a PMOS transistor 144 through an inverter 138, while the signal at the node 140 controls a NMOS transistor 146 through an inverter 142. Both the PMOS transistor 144 and the NMOS transistor 146 are designed to be turned off to keep a pad 148 in a high impedance state during a power-up process.

One drawback of the conventional power-on control circuit 106 is that it may not be able to regenerate a power-on control signal at the node 122 when the core voltage supply VDD is turned on after its initial power-up process. Initially, the I/O voltage supply VD33 is powered up and the core voltage supply VDD is turned off, the power-on control signal at the node 122 is low, thereby setting the post driver 102 in the high impedance state. The core voltage supply is subsequently powered up to set the power-on control signal at the node 122 high, thereby allowing the post driver 102 to freely respond to the internal signals 134 and 135. When the core voltage supply VDD is powered down for reasons such as power conservation, electrical charges will remain at the node 122. Thereafter, when the core voltage supply VDD is powered-up again, the electrical charges at the node 122 will prevent the power-on control circuit 106 to regenerate the power-on control signal that can set the post driver 102 in the high impedance state. As a result, the pad 148 may receive conflicting signals during the re-power-up process.

Figure 1B:
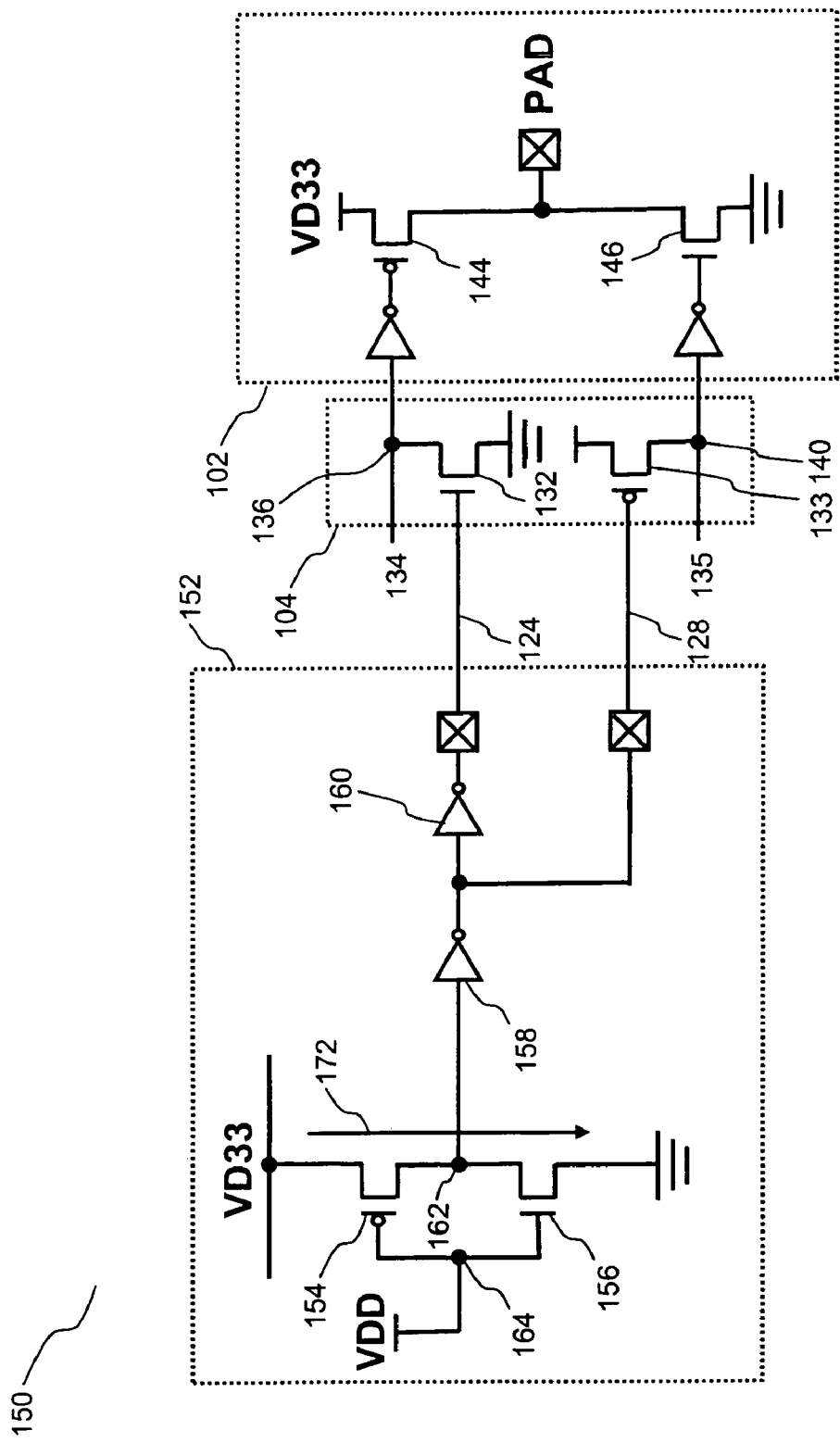
FIG. 1B schematically illustrates another conventional power-on control system.

FIG. 1B illustrates another conventional power-on control system 150 including the post driver 102, the protection circuit 104, and another conventional power-on control circuit 152. The post driver 102 and the protection circuit 104 operate in the same manner as explained in the detailed description with reference to FIG. 1A.

The power-on control circuit 152 includes an inverter constructed by a PMOS transistor 154 and an NMOS transistor 156 along with two other inverters 158 and 160. The source of the PMOS transistor 154 is coupled to the I/O supply voltage VD33, while the source of the NMOS transistor 156 is tied to ground. The drains of both the PMOS transistor 154 and the NMOS transistor 156 are coupled together at a node 162. The gates of both the PMOS transistor 154 and the NMOS transistor 156 are also coupled together at a node 164 which is further tied to the core voltage supply VDD.

One drawback of the conventional power-on control circuit 152 is that it may consume unnecessary power when both the I/O and core voltage supplies are turned on. The voltages VD33 and VDD may turn on both the NMOS transistor 156 and the PMOS transistor 154 simultaneously, thereby creating a leakage current from the I/O voltage supply VD33 to ground via a current path 172.

Figure 2:
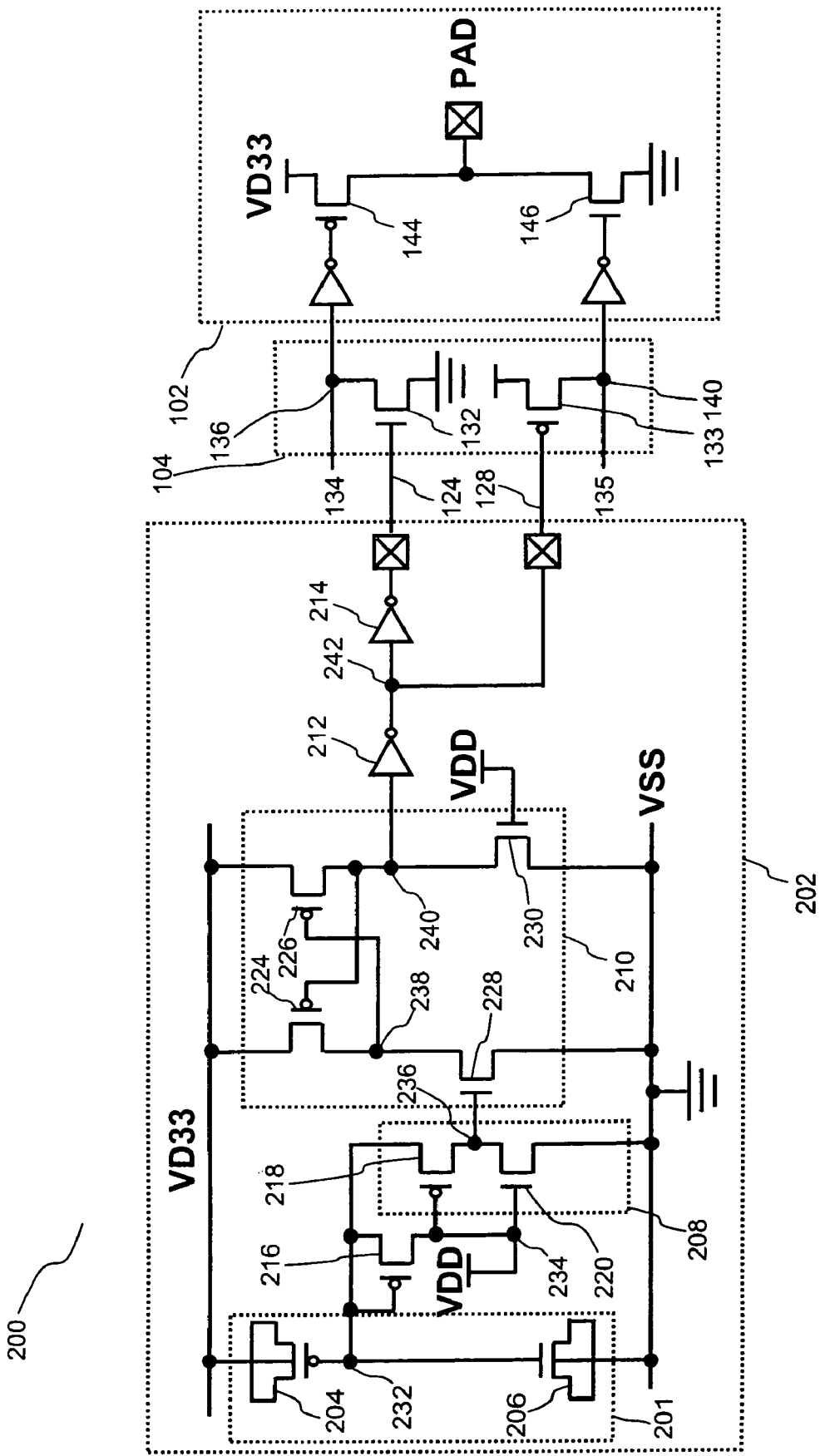
FIG. 2 schematically illustrates a power-on control system in accordance with one embodiment of the present invention.

FIG. 2 illustrates a power-on control system 200 including a regenerative power-on control circuit 202 implemented with the post driver 102 and the protection circuit 104 in accordance with one embodiment of the present invention. The protection circuit 104 and the post driver 102 operate in a similar manner set forth in the detailed description with reference to FIG. 1A.

The power-on control circuit 202 includes a coupling device 201, inverters 208, 212, and 214, a level shifter 210, and a switch device, such as a PMOS transistor 216. The coupling device 201 further includes a PMOS capacitor 204 coupled between the I/O voltage supply VD33 and a node 232, and an NMOS capacitor 206 coupled between the node 232 and a complementary voltage, such as VSS or ground, in series with the PMOS capacitor 204. The inverter 208, which includes a PMOS transistor 218 and an NMOS transistor 220, is coupled between the node 232 and the complementary voltage VSS. An input node of the inverter 208 connects the gates of the PMOS and NMOS transistors 218 and 220 to the core voltage supply VDD. An output node 236 of the inverter 208 is connected to the drains of the PMOS and NMOS transistors 218 and 220. The level shifter 210 is coupled between the I/O voltage supply VD33 and the complementary voltage VSS. The level shifter 210 has a first input node connected to the output node 236 of the first inverter 208 and a second input node coupled to the core voltage supply VDD. Within the level shifter 210, a PMOS transistor 224 is coupled to the I/O voltage supply VD33 and an NMOS transistor 228 is serially coupled between the PMOS transistor 224 and the complementary voltage VSS. A PMOS transistor 226 is coupled to the I/O voltage supply VD33 and an NMOS transistor 230 is serially coupled between the PMOS transistor 226 and the complementary voltage VSS. The gates of the NMOS transistors 228 and 230 are connected to the input nodes of the level shifter 210, respectively. The gates of the PMOS transistors 224 and 226 are connected to the drains of the PMOS transistors 226 and 224, respectively. The PMOS transistor 216 is coupled between the node 232 and the core voltage supply VDD through the input node 234 of the inverter 208. The gate of the PMOS transistor 216 is also connected to the node 232.

The voltage level at the node 232 is determined by adjusting capacitances of the PMOS and NMOS capacitors 203 and 206, when the I/O voltage supply VD33 is powered up. Depending on the voltage level of the I/O and core voltage supplies, the level shifter 210 generates a power-on control signal at its output node 240. The inverter 212 outputs an inverted power-on control signal at a node 242, which is further inverted by the inverter 214. The signals at the power-on control signal lines 124 and 128 controls the protection circuit 104 to set the post driver 102 in various states.

When the I/O voltage supply VD33 is powered up and the core voltage supply VDD is not yet turned on, the voltage at the node 232 will go up to VD33×[C204/(C204+C206)], where C204 and C206 are the capacitances of the capacitors 204 and 206, respectively. The voltage at the node 232 will turn off the PMOS transistor 216, thereby preventing the voltage from reaching the node 234 through the PMOS transistor 216. Since the core voltage supply VDD is not yet turned on, the voltage at the node 234 will remain low to turn on the PMOS transistor 218 and turn off the NMOS transistor 220, thereby pulling the node 236 high to the voltage of the node 232. As a result, the NMOS transistor 228 of the level shifter 210 will be turned on, thus pulling a node 238 low to the complementary voltage VSS. This also turns on the PMOS transistor 226 pulling the node 240 high to voltage VD33. Meanwhile, since the core voltage supply VDD is not yet powered on, the NMOS transistor 230 of the level shifter 210 is off, and the voltage VD33 at the node 240 will turn off the PMOS transistor 224. The node 242 will have a low signal due to the inverter 212, thereby allowing the power-on control signal line 124 to have a high signal through the inverter 214 and the power-on control signal line 128 to have a low signal. This results in turning on both the NMOS transistor 132 and the PMOS transistor 133, thereby pulling the node 136 low and pulling the node 140 high. Both the PMOS transistor 144 and the NMOS transistor 146 will be turned off to set the post driver 102 in the high impedance state.

As the core voltage supply VDD is powered up, the node 234 will have a core voltage VDD, thereby turning on the NMOS transistor 220 to pull the node 236 low, and turning off the NMOS transistor 228. Meanwhile, the NMOS transistor 230 will be turned on pulling the node 240 low to VSS. As a result, the PMOS transistor 224 will be turned on pulling the node 238 high to I/O voltage VD33 turning off the PMOS transistor 226. The complementary voltage VSS at the node 240 will provide the node 242 with a high signal through the inverter 212. This allows the power-on control signal line 124 to have a low signal through the inverter 214, while also providing the power-on control signal line 128 with a high signal. This turns off both the NMOS transistor 132 and the PMOS transistor 133, thereby allowing the internal signals 134 and 135 to reach the nodes 136 and 140 accordingly, to allow the post driver 102 to operate normally.

When the core voltage supply VDD is powered off while the I/O voltage supply VD33 is still on, the NMOS transistor 220 is turned off and the PMOS transistor 218 is turned on. This allows the node 236 to be pulled high to the voltage at the node 232, thereby turning on the NMOS transistor 228. This pulls the node 238 low, thus turning on the PMOS transistor 226 and pulling the node 240 high to I/O voltage VD33. The NMOS transistor 230 is turned off when VDD is powered off, and the PMOS transistor 224 will also be turned off by the high signal at the node 240. The node 242 will have a low signal due to the inverter 212, thereby providing the power-on control signal line 124 with a high signal through the inverter 214 while also providing the power-on control signal line 128 with a low signal. This results in turning on both the NMOS transistor 132 and the PMOS transistor 133, thereby pulling the node 136 low and pulling the node 140 high. Both the PMOS transistor 144 and the NMOS transistor 146 will be turned off to set the post driver 102 in the high impedance state.

When the core voltage supply VDD is powered back on, the power-on control signal at the power-on control signal lines 124 and 128 can be regenerated. The core voltage VDD at the node 234 will turn off the PMOS transistor 218 and turn on the NMOS transistor 220 pulling the node 236 low. Meanwhile, the NMOS transistor 230 will be turned on, thus pulling the node 240 low to VSS. As a result, the PMOS transistor 224 will be turned on pulling the node 238 high to I/O voltage VD33 turning off the PMOS transistor 226. The node 242 will have a high signal due to the inverter 212. This provides a low signal through the inverter 214 to the power-on control signal line 124 and a high signal to the power-on control signal line 128. This turns off both the NMOS transistor 132 and the PMOS transistor 133, thereby allowing the internal signals 134 and 135 to reach the nodes 136 and 140 accordingly to allow the normal operation of the post driver 102.

The power-on control circuit 202 is able to regenerate the power-up control signal when the core voltage supply VDD is powered down and then back up again. The coupling device 201 eliminates a leakage current path from the I/O voltage supply VD33 to the complementary voltage VSS through the inverter 208. This avoids unnecessary power consumption when both the I/O and core voltage supplies are turned on. The PMOS transistor 216 can be designed to switch on and off along with the core voltage supply VDD. This can assure that the node 232 is properly charged.

Figure 3:
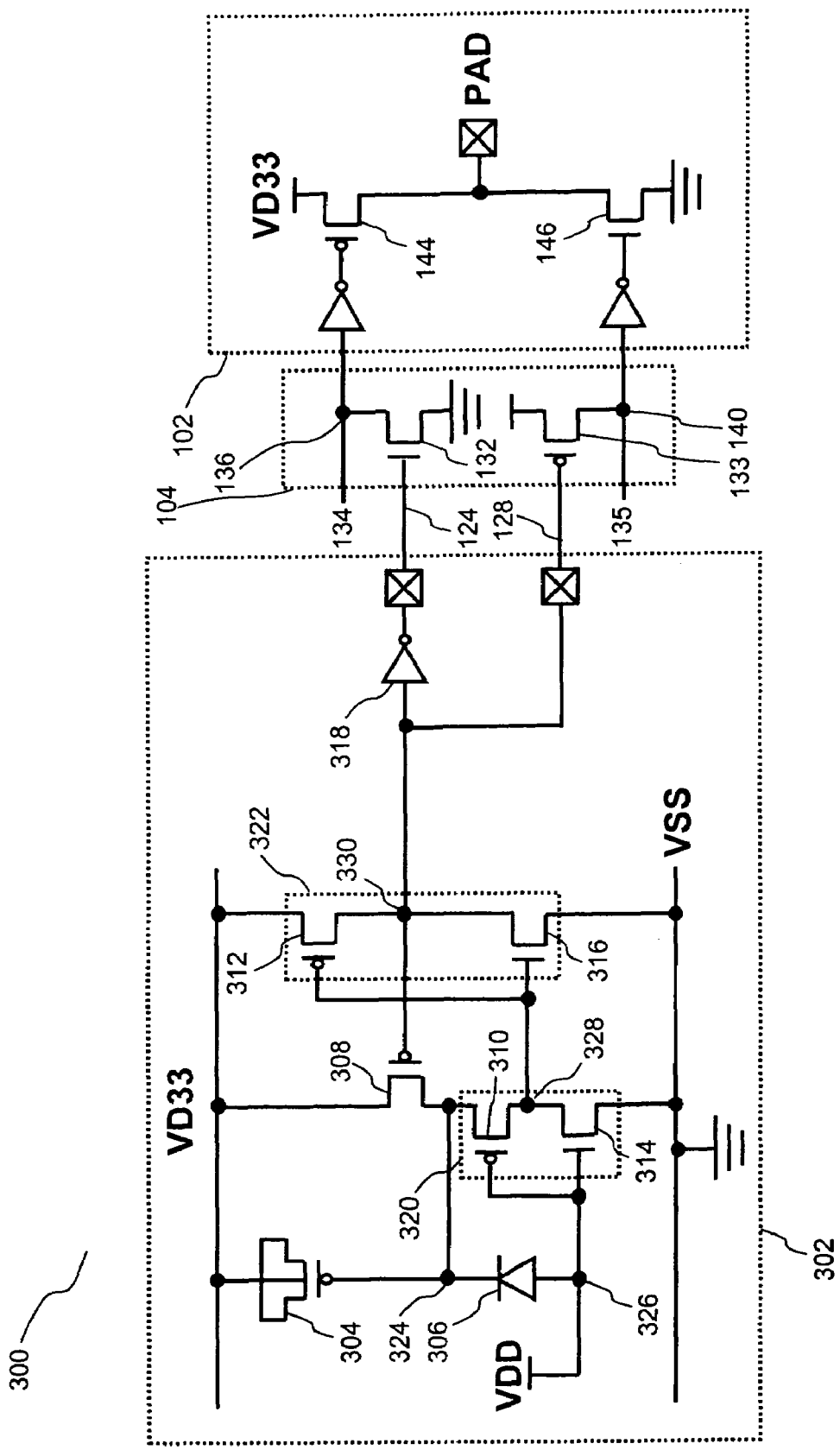
FIG. 3 schematically illustrates a power-on control system in accordance with another embodiment of the present invention.

FIG. 3 illustrates a power-on control system 300 including a regenerative power-on control circuit 302 implemented with the post driver 102 and the protection circuit 104 in accordance with another embodiment of the present invention. The protection circuit 104 and the post driver 102 operate in a similar manner to that set forth in the detailed description with reference to FIG. 1A.

The power-on control circuit 302 includes a coupling device such as a PMOS capacitor 304, a switch device such as a diode 306, three PMOS transistors 308, 310, and 312, two NMOS transistors 314 and 316, and an inverter 318. The PMOS transistor 310 and the NMOS transistor 314 together form an inverter 320 while the PMOS transistor 312 and the NMOS transistor 316 together form another inverter 322 with a level shifting characteristic. The diode 306 is inserted between the core voltage supply VDD and a node 324 to ensure a minimum voltage level at the node 324 after the power on of the core voltage supply VDD. The PMOS capacitor 304 is implemented to adjust the voltage at the node 324 for activating the power-on control circuit 302 when needed. This power-on control circuit 302 is designed to disable the power-on control signal at a node 318 when the core voltage supply is powered up. When the core voltage supply VDD goes off for reasons such as power conservation, the voltage at the node 324 is designed to sustain high to allow regeneration of the power-on control signal.

When the I/O voltage supply is powered up and the core voltage supply VDD is not yet powered on, the PMOS capacitor 304 will provide a certain level of voltage at the node 324 while the core voltage at a node 326 will turn off the NMOS transistor 314 while turning on the PMOS transistor 310. This allows the voltage at the node 324 to reach a node 328, thereby turning off the PMOS transistor 312 and turning on the NMOS transistor 316. This further allows a node 330 to be pulled low to the complementary voltage VSS, thereby turning on the PMOS transistor 308. Accordingly, since the node 324 reaches the I/O voltage VD33, the PMOS transistor 308 may be seen as a charging module. The core voltage at the node 330 provides the power-on control signal line 124 with a high signal through the inverter 318 while providing the power-on control signal line 128 with a low signal. This results in turning on both the NMOS transistor 132 and the PMOS transistor 133, thereby pulling the node 136 low and pulling the node 140 high. Both the PMOS transistor 144 and the NMOS transistor 146 will be turned off to set the post driver 102 in the high impedance state.

As the core voltage supply VDD is powered up, the NMOS transistor 314 will be turned on and the PMOS transistor 310 will be turned off. The node 328 will be pulled low to the complementary voltage VSS, thereby turning off the NMOS transistor 316 and turning on the PMOS transistor 312. This allows the node 330 to be pulled high to the I/O voltage VD33. Accordingly, the I/O voltage at the node 330 will turn off the PMOS transistor 308, and provide the power-on control signal line 124 with a low signal and the power-on control signal line 128 with a high signal. Both the NMOS transistor 132 and the PMOS transistor 133 will then be turned off, thereby allowing the internal signals 134 and 135 to reach the nodes 136 and 140.

When the core voltage supply VDD is powered off while the I/O voltage supply VD33 is still on, the NMOS transistor 314 is turned off and the PMOS transistor 310 is turned on. This allows the node 328 to be pulled high, thereby turning on the NMOS transistor 316 and turning off the PMOS transistor 312. This pulls the node 330 low, thereby turning on the PMOS transistor 308 to allow the I/O voltage VD33 to reach the node 324. With the low signal at the node 330, a high signal will be present at the power-on control signal line 124 through the inverter 318, while a low signal will be present at the power-on control signal line 128. Accordingly, both the NMOS transistor 132 and the PMOS transistor 133 will be turned on, thereby pulling the node 136 low and pulling the node 140 high. Both the PMOS transistor 144 and the NMOS transistor 146 will be turned off. When the core voltage supply VDD is powered back on, the power-on control signal at the power-on control signal lines 124 and 128 can be regenerated.

The control circuit as discussed above allows regeneration of the power-on control signal when the core voltage supply is powered off and back up again, without unnecessary power consumption.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A power-on control circuit for generating a power-on control signal, comprising:
   a coupling device coupled to a first voltage supply;
   a first inverter, coupled between the coupling device and a complementary voltage, having an input node coupled to a second voltage supply with a supply voltage level lower than that of the first voltage supply; and
   a level shifter, coupled between the first voltage supply and the complementary voltage, having a first input node connected to an output node of the first inverter and a second input node coupled to the second voltage supply, for generating the power-on control signal when the first voltage supply is powered up and the second voltage supply is turned off and for disabling the power-on control signal when the second voltage supply is subsequently powered up,
   wherein the coupling device eliminates a leakage current path from the first voltage supply to the complementary voltage through the first inverter,
   wherein the coupling device comprises a PMOS capacitor and an NMOS capacitor serially coupled between the first voltage supply and the complementary voltage.

2. The power-on control circuit of claim 1 wherein a voltage level at a node between the coupling device and the first inverter is determined by adjusting capacitances of the PMOS and NMOS capacitors, when the first voltage supply is powered up.

3. The power-on control circuit of claim 1 wherein the first inverter comprises a PMOS transistor coupled to the coupling device and an NMOS transistor serially coupled between the PMOS transistor and the complementary voltage, a gate of the PMOS transistor and a gate of the NMOS transistor are coupled to the second voltage supply through the input node of the first inverter.

4. The power-on control circuit of claim 1 wherein the level shifter comprises a first PMOS transistor coupled to the first voltage supply and a first NMOS transistor serially coupled between the first PMOS transistor and the complementary voltage, and a second PMOS transistor coupled to the first voltage supply and a second NMOS transistor serially coupled between the second PMOS transistor and the complementary voltage, the gates of the first and second NMOS transistors being connected to the first and second input nodes of the level shifter, respectively, the gates of the first and second PMOS transistors being connected to the drains of the second and first PMOS transistors, respectively.

5. The power-on control circuit of claim 4 further comprising a second inverter coupled to the level shifter for inverting the power-on control signal output therefrom.

6. The power-on control circuit of claim 1 wherein the level shifter comprises a first PMOS transistor coupled to the first voltage supply and an NMOS transistor serially coupled between the first PMOS transistor and the complementary voltage, the first PMOS and NMOS transistors having gates connected to an output node of the first inverter and drains connected to the output node of the level shifter.

7. The power-on control circuit of claim 6 further comprising a second PMOS transistor coupled between the first voltage supply and the first inverter with its gate connected to the output node of the level shifter.

8. The power-on control circuit of claim 1 further comprising a switch device coupled between the input node of the first inverter and the coupling device, the switch device being turned on when the second voltage supply is on and being turned off when the second voltage supply is off.

9. The power-on control circuit of claim 8 wherein the switch device is a diode.

10. The power-on control circuit of claim 8 wherein the switch device is a PMOS transistor having its drain and gate coupled to the coupling device and its source coupled to the input node of the first inverter.

11. A power-on control circuit for generating a power-on control signal, comprising:
    a coupling device coupled to an I/O voltage supply;
    a first inverter, coupled between the coupling device and ground, having an input node coupled to a core voltage supply with a supply voltage level lower than that of the I/O voltage supply;
    a switch device coupled between the input node of the first inverter and the coupling device, the switch device being turned on when the core voltage supply is on and being turned off when the core voltage supply is off; and
    a level shifter, coupled between the I/O voltage supply and ground, having a first input node connected to an output node of the first inverter and a second input node coupled to the core voltage supply, for generating the power-on control signal when the I/O voltage supply is powered up and the core voltage supply is turned off and for disabling the power-on control signal when the core voltage supply is subsequently powered up; and
    a second inverter coupled to the level shifter for inverting the power-on control signal output therefrom,
    wherein the coupling device eliminates a leakage current path from the I/O voltage supply to ground through the first inverter.

12. The power-on control circuit of claim 11 wherein the coupling device comprises a PMOS capacitor and an NMOS capacitor serially coupled between the I/O voltage supply and the complementary voltage.

13. The power-on control circuit of claim 12 wherein a voltage level at a node between the coupling device and the first inverter is determined by adjusting capacitances of the PMOS and NMOS capacitors, when the I/O voltage supply is powered up.

14. The power-on control circuit of claim 11 wherein the first inverter comprises a PMOS transistor coupled to the coupling device and an NMOS transistor serially coupled between the PMOS transistor and the complementary voltage, a gate of the PMOS transistor and a gate of the NMOS transistor are coupled to the core voltage supply through the input node of the first inverter.

15. The power-on control circuit of claim 11 wherein the level shifter comprises a first PMOS transistor coupled to the I/O voltage supply and a first NMOS transistor serially coupled between the first PMOS transistor and ground, and a second PMOS transistor coupled to the I/O voltage supply and a second NMOS transistor serially coupled between the second PMOS transistor and ground, the gates of the first and second NMOS transistors being connected to the first and second input nodes of the level shifter, respectively, the gates of the first and second PMOS transistors being connected to the drains of the second and first PMOS transistors, respectively.

16. The power-on control circuit of claim 11 wherein the switch device is a MOS transistor or diode.

17. A power-on control circuit for generating a power-on control signal, comprising:
    a coupling device coupled to the I/O voltage supply;

a first inverter, coupled between the coupling device and ground, having an input node coupled to a core voltage supply with a supply voltage level lower than that of the I/O voltage supply;

a switch device coupled between the input node of the first inverter and the coupling device, the switch device being turned on when the core voltage supply is on and being turned off when the core voltage supply is off; and a level shifter, coupled between the I/O voltage supply and ground, having a first input node connected to an output node of the first inverter and a second input node coupled to the core voltage supply, for generating the power-on control signal when the I/O voltage supply is powered up and the core voltage supply is turned off and for disabling the power-on control signal when the core voltage supply is subsequently powered up, wherein the coupling device eliminates a leakage current path from the I/O voltage supply to ground through the first inverter.

18. The power-on control circuit of claim 17 wherein the coupling device comprises at least one PMOS capacitor.

19. The power-on control circuit of claim 17 wherein the first inverter comprises a PMOS transistor coupled to the coupling device and an NMOS transistor serially coupled between the PMOS transistor and the complementary voltage, a gate of the PMOS transistor and a gate of the NMOS transistor are coupled to the core voltage supply through the input node of the first inverter.

20. The power-on control circuit of claim 17 wherein the level shifter comprises a first PMOS transistor coupled to the I/O voltage supply and an NMOS transistor serially coupled between the first PMOS transistor and ground, the first PMOS and NMOS transistors having gates connected to an output node of the first inverter and drains connected to the output node of the level shifter.

21. The power-on control circuit of claim 20 further comprising a second PMOS transistor coupled between the I/O voltage supply and the first inverter with its gate connected to the output node of the level shifter.

22. The power-on control circuit of claim 17 wherein the switch device is a MOS transistor or diode.

* * * * *